(12) United States Patent
Otani et al.

(10) Patent No.: US 10,153,082 B2
(45) Date of Patent: Dec. 11, 2018

(54) ELECTRONIC COMPONENT AND METHOD OF MANUFACTURING ELECTRONIC COMPONENT

(71) Applicant: Murata Manufacturing Co., Ltd., Kyoto (JP)

(72) Inventors: Shinji Otani, Nagaokakyo (JP); Masaki Tsutsumi, Nagaokakyo (JP); Yoshinori Ueda, Nagaokakyo (JP); Hayami Kudo, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 177 days.

(21) Appl. No.: 15/298,577

(22) Filed: Oct. 20, 2016

(65) Prior Publication Data

US 2017/0162319 A1 Jun. 8, 2017

(30) Foreign Application Priority Data

Dec. 4, 2015 (JP) ................. 2015-237751

(51) Int. Cl.
*H01F 27/24* (2006.01)
*H01F 5/00* (2006.01)
(Continued)

(52) U.S. Cl.
CPC ............... *H01F 27/29* (2013.01); *H01C 1/14* (2013.01); *H01C 7/008* (2013.01); *H01C 7/18* (2013.01); *H01C 17/28* (2013.01); *H01F 1/0306* (2013.01); *H01F 17/0013* (2013.01); *H01F 17/0033* (2013.01); *H01F 17/04* (2013.01); *H01F 27/255* (2013.01); *H01F 27/2804* (2013.01); *H01F 41/0206* (2013.01); *H01G 4/008* (2013.01); *H01G 4/232* (2013.01); *H01G 4/236* (2013.01);
(Continued)

(58) Field of Classification Search
USPC ........................................................ 336/233
See application file for complete search history.

(56) References Cited

U.S. PATENT DOCUMENTS

| 9,728,316 B2* | 8/2017 | Mimura ................ H01F 27/327 |
| 2016/0086717 A1* | 3/2016 | Harada ................. H01F 27/255 336/233 |
| 2016/0155550 A1* | 6/2016 | Ohkubo .................... H01F 1/24 336/233 |

(Continued)

FOREIGN PATENT DOCUMENTS

| JP | 2010-186909 A | 8/2010 |
| WO | 2015/115180 A1 | 8/2015 |

OTHER PUBLICATIONS

An Office Action; "Notification of Reasons for Refusal," Mailed by the Japanese Patent Office dated May 29, 2018, which corresponds to Japanese Patent Application No. 2015-237751 and is related to U.S. Appl. No. 15/298,577 with English language translation.

*Primary Examiner* — Ronald Hinson
(74) *Attorney, Agent, or Firm* — Studebaker & Brackett PC

(57) ABSTRACT

An electronic component includes a composite body made of a composite material of a resin material and a metal powder; and a metal film disposed on an outer surface of the composite body. The metal film is in contact with the resin material and the metal powder of the composite body, and an average particle diameter of crystals of the metal film contacting the resin material is 60% or more and 120% or less of an average particle diameter of crystals of the metal film contacting the metal powder.

15 Claims, 3 Drawing Sheets

(51) Int. Cl.

| | | |
|---|---|---|
| *H01F 27/28* | (2006.01) | |
| *H01F 27/29* | (2006.01) | |
| *H01C 7/00* | (2006.01) | |
| *H01C 17/28* | (2006.01) | |
| *H01F 1/03* | (2006.01) | |
| *H01F 27/255* | (2006.01) | |
| *H01F 41/02* | (2006.01) | |
| *H01G 4/008* | (2006.01) | |
| *H01G 4/252* | (2006.01) | |
| *H01G 4/40* | (2006.01) | |
| *H01L 41/047* | (2006.01) | |
| *H01G 4/33* | (2006.01) | |
| *H01C 1/14* | (2006.01) | |
| *H01C 7/18* | (2006.01) | |
| *H01G 4/232* | (2006.01) | |
| *H01G 4/236* | (2006.01) | |
| *H01F 17/00* | (2006.01) | |
| *H01F 17/04* | (2006.01) | |
| *H05K 1/16* | (2006.01) | |

(52) U.S. Cl.
CPC .......... *H01G 4/2325* (2013.01); *H01G 4/252* (2013.01); *H01G 4/33* (2013.01); *H01G 4/40* (2013.01); *H01L 41/0477* (2013.01); *H01F 2017/048* (2013.01); *H05K 1/165* (2013.01)

(56) References Cited

U.S. PATENT DOCUMENTS

2016/0155566 A1* 6/2016 Yoon .................. H01F 1/14741
336/233

* cited by examiner

ELECTRONIC COMPONENT AND METHOD OF MANUFACTURING ELECTRONIC COMPONENT

CROSS REFERENCE TO RELATED APPLICATIONS

This application claims benefit of priority to Japanese Patent Application 2015-237751 filed Dec. 4, 2015, the entire content of which is incorporated herein by reference.

TECHNICAL FIELD

The present disclosure relates to an electronic component and a method of manufacturing an electronic component.

BACKGROUND

Conventional electronic components include an electric component described in WO 2015/115180A1. This electronic component has a composite body made of a composite material of a resin material and a metal powder, and an external electrode disposed on the composite body. The external electrode is formed by electrolytic plating. As a result, the external electrode and the metal powder are metal-bonded so that the external electrode strongly adheres to the composite body.

SUMMARY

Problem to be Solved by the Disclosure

The present inventors conceived not only improving adhesion due to a bond between the external electrode and the metal powder but also improving adhesion between the external electrode and the resin material for the following reasons.

It has recently been attempted in circuits using electronic components to make frequencies of signals higher to improve characteristics and functions. It is expected that as higher-frequency signals are dealt with in the future, a magnetic loss generated in the metal powder of the electronic component becomes larger. Therefore, to reduce the magnetic loss, it is conceived that particles of the metal powder are made smaller in particle diameter as compared to conventional particles.

Since the metal powder smaller in particle diameter reduces surface roughness and increases flatness on a surface of the composite body on which the external electrode is disposed, the anchor effect is hardly produced, which reduces the adhesion of the external electrode to the composite body. Moreover, since the metal powder smaller in particle diameter increases the possibility of the metal powder shedding particles from the composite body, a proportion of the metal powder decreases in a portion of the composite body contacting with the external electrode, and a proportion of a resin material accordingly increases. Therefore, a proportion of the contact portion between the external electrode and the metal powder associated with a strong bonding force decreases, while a proportion of the contact portion between the external electrode and the resin material associated with a weak bonding force increases, resulting in a reduction in adhesion of the external electrode to the composite body.

Therefore, a problem to be solved by the present disclosure is to provide an electronic component and a method of manufacturing an electronic component improving the adhesion of the external electrode to the composite body.

Solutions to the Problems

To solve the problem, the present disclosure provides an electronic component comprising:

a composite body made of a composite material of a resin material and a metal powder; and a metal film disposed on an outer surface of the composite body, wherein the metal film is in contact with the resin material and the metal powder of the composite body, and wherein an average particle diameter of crystals of the metal film contacting the resin material is 60% or more and 120% or less of an average particle diameter of crystals of the metal film contacting the metal powder.

According to the electronic component of the present disclosure, the metal film is in contact with the resin material and the metal powder of the composite body, and an average particle diameter of crystals of the metal film contacting the resin material is 60% or more and 120% or less of an average particle diameter of crystals of the metal film contacting the metal powder. A state of the metal film having a small difference in average particle diameter of crystals between on the metal powder and on the resin material corresponds to a state in which the metal film with a comparatively small particle diameter has been able to be formed on the resin material. Therefore, the anchor effect is easily produced between the metal film and the resin material so that the adhesion between the resin material and the metal film can be improved. Thus, the adhesion on the resin material can be ensured to improve the adhesion of the entire metal film.

In an embodiment of the electronic component, the outer surface of the composite body has a recess such that the inside of the recess is filled with the metal film.

According to the embodiment, since the inside of the recess is filled with the metal film, the adhesion between the metal film and the composite body can further be improved.

In an embodiment of the electronic component, a portion of the film thickness of the metal film on the metal powder is equal to or less than the film thickness of the metal film on the resin material.

According to the embodiment, since a portion of the film thickness of the metal film on the metal powder is equal to or less than the film thickness of the metal film on the resin material, the unevenness in the electronic component can be reduced. Particularly when the metal film serves as external electrodes, the mounting stability and the reliability are improved and, if the metal film serves as internal electrodes, the stability at the time of lamination is improved.

In an embodiment of the electronic component, the electronic component comprises an internal electrode embedded in the composite body, and the metal film is in contact with the internal electrode.

According to the embodiment, since the metal film is in contact with the internal electrode, the metal film and the internal electrode are sterically disposed and, therefore, internal members can be disposed without being affected by a disposition area of the metal film.

In an embodiment of the electronic component, the metal film and the internal electrode are made of the same material.

According to the embodiment, since the metal film and the internal electrode are made of the same material, the adhesion between the metal film and the internal electrode is improved.

In an embodiment of the electronic component, the outer surface of the composite body has a principal surface, and the metal powder is exposed from the resin material at the principal surface and the metal film is disposed thereon.

According to the embodiment, since the metal powder is exposed from the resin material at the principal surface of the composite body and the metal film is disposed thereon, when the metal film is formed on the principal surface of the composite body, the exposed metal powder can be used and the manufacturing efficiency is improved.

In an embodiment of the electronic component, a shape of the metal powder exposed from the resin material includes a shape acquired by cutting a portion of an ellipsoid.

According to the embodiment, since a shape of the metal powder exposed from the resin material includes a shape acquired by cutting a portion of an ellipsoid, the metal film formed on this metal powder can be improved in the adhesion to the composite body.

In an embodiment of the electronic component, a resin film is disposed on a portion of the principal surface without the metal film disposed thereon, and the resin film covers the metal powder exposed from the resin material.

According to the embodiment, since a resin film is disposed on a portion of the principal surface without the metal film disposed thereon and the resin film covers the metal powder exposed from the resin material, the exposure of the metal powder to the outside can be prevented.

In an embodiment of the electronic component, the metal film is partially disposed on the resin film.

According to the embodiment, since the metal film is partially disposed on the resin film, the resin film can be substituted for a mask at the time of pattern formation of the metal film, and the manufacturing efficiency of the metal film formation is improved.

In an embodiment of the electronic component, the metal powder is made of metal or alloy containing Fe, and the metal film is made of metal or alloy containing Cu.

According to the embodiment, since the metal powder is made of metal or alloy containing Fe and the metal film is made of metal or alloy containing Cu, the metal film can be formed by electroless plating without using a catalyst. Since the metal powder is made of metal or alloy containing Fe, the magnetic permeability can be improved and, since the metal film is made of metal or alloy containing Cu, the conductivity can be improved.

In an embodiment of the electronic component, the film thickness of the metal film on the metal powder is 60% or more and 160% or less of the film thickness of the metal film on the resin material.

According to the embodiment, since the film thickness of the metal film on the metal powder is 60% or more and 160% or less of the film thickness of the metal film on the resin material, the film thickness of the metal film becomes uniform. Therefore, the unevenness in the electronic component can be reduced. Particularly, when the metal film serves as external electrodes, the mounting stability and the reliability are improved and, when the metal film serves as internal electrodes, the stability at the time of lamination is improved.

In an embodiment of the electronic component, Pd does not exist in the interface between the metal powder and the metal film as well as the interface between the resin material and the metal film.

According to the embodiment, Pd does not exist in the interface between the metal powder and the metal film as well as the interface between the resin material and the metal film. The metal film is formed without applying a catalyst, and the manufacturing efficiency of the metal film formation is improved.

In an embodiment of the electronic component, Pd does not exist in the interface between the resin material and the metal film, and Pd exists in the interface between the metal powder and the metal film.

According to the embodiment, while Pd does not exist in the interface between the resin material and the metal film, Pd exists in the interface between the metal powder and the metal film, and therefore, the metal film can be formed by electroless plating by using the catalyst Pd. In particular, even if the metal film is baser than the metal powder, a displacement Pd catalyst treatment can be performed to form the metal film. Therefore, a degree of freedom is improved in terms of material selection for the metal powder and the metal film.

In an embodiment of the electronic component, a portion of the metal film goes around along the outer surface of the metal powder to the inner side of the composite body.

According to the embodiment, since a portion of the metal film goes around along the outer surface of the metal powder to the inner side of the composite body, an increase in area of contact with the metal powder improves the bonding force with the metal powder, and the contact with the composite body along the shape of the gap between the resin material and the metal powder improves the anchor effect with the composite body.

In an embodiment of the electronic component, a crystal particle diameter of the metal film is made larger from the side contacting with the composite body toward the opposite side thereof.

According to the embodiment, since a crystal particle diameter of the metal film is made larger from the side contacting with the composite body toward the opposite side thereof, the metal film has a relatively small crystal particle diameter on the side contacting with the composite body and, therefore, the metal film easily produces the anchor effect with the resin material, so that the adhesion between the metal film and the composite body can be improved.

An embodiment of a method of manufacturing an electronic component comprises a grinding step of grinding a portion of a composite body made of a composite material of a resin material and a metal powder to expose the metal powder from a ground surface of the composite body; and a metal film formation step of forming a metal film on the ground surface of the composite body by using electroless plating.

According to the embodiment, a portion of the composite body is ground to expose the metal powder from a ground surface of the composite body and a metal film is formed on the ground surface of the composite body by using electroless plating. As a result, the adhesion between the metal film and the composite body and the film strength and conductivity of the metal film itself can be improved. Additionally, a desired thickness can be acquired with reduced variations, and the metal film can be formed by a simple method with a high manufacturing efficiency.

In an embodiment of the method of manufacturing an electronic component, at the metal film formation step, the metal film is formed on the resin material and the metal powder by using the electroless plating.

According to the embodiment, at the metal film formation step, the metal film is formed on the resin material and the metal powder by using the electroless plating and, therefore, the bonding force between the metal film and the metal powder is improved and, even when unevenness on the resin material is slight, the metal film can be formed along the unevenness and the adhesion between the metal film and the resin material can be ensured.

In an embodiment of the method of manufacturing an electronic component, at the metal film formation step, the metal film is formed by using a displacement precipitation reaction to precipitate the metal film on the metal powder exposed from the ground surface and by growing the precipitated metal film by using the electroless plating.

According to the embodiment, at the metal film formation step, the metal film is formed by using a displacement precipitation reaction to precipitate the metal film on the metal powder exposed from the ground surface and by growing the precipitated metal film by using the electroless plating and, therefore, the metal film can be formed in a simple process.

In an embodiment of the method of manufacturing an electronic component, at the metal film formation step, the electroless plating is performed without applying a catalyst.

According to the embodiment, at the metal film formation step, the electroless plating is performed without applying a catalyst and, therefore, the metal film can be formed in a simple process.

In an embodiment of the method of manufacturing an electronic component, the metal powder is made of metal or alloy containing Fe, and the metal film is made of metal or alloy containing Cu.

According to the embodiment, since the metal powder is made of metal or alloy containing Fe and the metal film is made of metal or alloy containing Cu, the metal film can be formed by the electroless plating without using a catalyst. Since the metal powder is made of metal or alloy containing Fe, the magnetic permeability can be improved and, since the metal film is made of metal or alloy containing Cu, the conductivity can be improved.

An embodiment of the method of manufacturing an electronic component comprises a resin film formation step of forming a resin film on a region of a portion of the ground surface of the composite body after the grinding step, and the resin film is used as a mask to form the metal film at the metal film formation step.

According to the embodiment, since a resin film is formed on a region of a portion of the ground surface of the composite body after the grinding step and the resin film is used as a mask to form the metal film, the pattern formation can be achieved without etching the metal film and the manufacturing efficiency is improved.

Effect of the Disclosure

According to the electronic component and the method of manufacturing an electronic component of the present disclosure, the adhesion of the metal film to the composite body is improved.

DETAILED DESCRIPTION

The present disclosure will now be described in detail with reference to shown embodiments.

Figure 1:
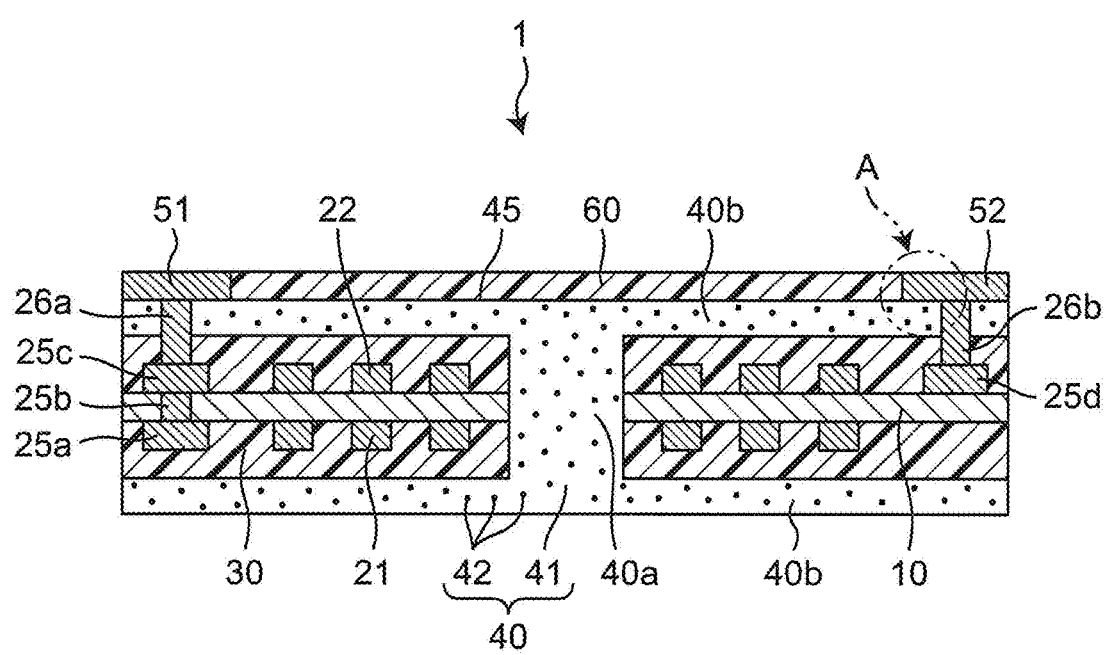
FIG. 1 is a cross-sectional view of an embodiment of an electronic component of the present disclosure.

FIG. 1 is a cross-sectional view of an embodiment of an electronic component of the present disclosure. As shown in FIG. 1, the electronic component 1 represents a coil component. The electronic component 1 has a substrate 10, first and second coil conductors 21, 22 disposed on upper and lower surfaces of the board 10, an insulator 30 covering the board 10 and the first and second coil conductors 21, 22, a composite body 40 covering the insulator 30, and first and second external electrode 51, 52 disposed in an upper surface of the composite body 40.

The board 10 is a printed-wiring board made of glass cloth impregnated with an epoxy resin. The board 10 may be made of an insulating resin such as benzocyclobutene or an insulating inorganic material such as glass ceramics. The thickness of the board 10 is about 80 μm, for example. In this application, the term "thickness" means a thickness along a thickness direction of the board 10 (an up-down direction on the plane of FIG. 1).

The first and second coil conductors 21, 22 are made of a conductive material such as Au, Ag, Cu, Pd, and Ni. The first coil conductor 21 is disposed on the lower surface of the board 10. The first coil conductor 21 is formed into a spiral shape swirling clockwise and away from the center when viewed from above, for example. The second coil conductor 22 is disposed on the upper surface of the board 10. The second coil conductor 22 is formed into a spiral shape swirling counterclockwise and away from the center when viewed from above, for example. The first and second coil conductors 21, 22 have a thickness of 40 μm or more and 120 μm or less, for example.

The first coil conductor 21 has an outer circumferential end connected to an extraction electrode 25a disposed on the lower surface of the board 10. The extraction electrode 25a is connected to a through-hole electrode 25b penetrating the board 10. The through-hole electrode 25b is connected to an extraction electrode 25c disposed on the board 10. The extraction electrode 25c is connected to an internal electrode 26a embedded in the composite body 40. The internal electrode 26a is connected to the first external electrode 51.

The second coil conductor 22 has an outer circumferential end connected to an extraction electrode 25d disposed on the upper surface of the board 10. The extraction electrode 25d is connected to an internal electrode 26b embedded in the composite body 40. The internal electrode 26a is connected to the second external electrode 52.

The first coil conductor 21 has an inner circumferential end connected through a via-hole electrode (not shown) penetrating the board 10, to an inner circumferential end of the second coil conductor 22. As a result, a signal input from the first external electrode 51 goes sequentially through the first coil conductor 21 and the second coil conductor 22 and is output from the second external electrode 52.

The insulator 30 is made of an epoxy resin etc. The insulator 30 may be made of an insulating resin such as benzocyclobutene or an insulating inorganic material such as glass ceramics. The thickness of the insulator 30 may be a thickness capable of covering the first and second coil conductors 21, 22 and is, for example, 45 μm or more and 150 μm or less.

The composite body 40 is made of a composite material of a resin material 41 and a metal powder 42. The resin material 41 may be, for example, an organic material such as a polyimide resin and an epoxy resin. The metal powder 42 may be, for example, powder made of a metal material such as Fe, Si, Cr, and Ni or made of an alloy material containing these metal materials. The metal powder 42 may be powder made of multiple types of materials. The average particle diameter of the metal powder 42 is, for example, 0.1 µm or more and 5 µm or less, and the metal powder 42 having such a small particle diameter prominently produces the effect of the configuration of the electronic component 1, as described later. The average particle diameter of the metal powder 42 is calculated as is the case with an average particle diameter of crystals of the metal film described later. During manufacturing processes of the electronic component 1, the average particle diameter of the metal powder 42 can be calculated as a particle diameter corresponding to 50% of an integrated value in particle size distribution obtained by a laser diffraction/scattering method.

The composite body 40 has an inner magnetic path 40a and an outer magnetic path 40b. The inner magnetic path 40a is located in the inner diameters of the first and second coil conductors 21, 22. The outer magnetic path 40b is located above and below the first and second coil conductors 21, 22. The thickness of the outer magnetic path 40b is, for example, 10 µm or more and 50 µm or less.

The first and second external electrodes 51, 52 are formed of a metal film disposed on a principal surface 45 on the exterior of the composite body 40 and a film formed by using electroless plating. The metal film may be, for example, a film made of a metal material such as Au, Ag, Pd, Ni, and Cu, an alloy material thereof, or a material acquired by allowing these materials to contain P or B. The film thickness of the metal film is, for example, 5 µm and is preferably 1 µm or more and 10 µm or less. The first and second external electrodes 51, 52 may have a laminated configuration in which a surface of the metal film is further covered with another plating film. In the following description, it is assumed that the first and second external electrodes 51, 52 are a single layer of the metal film.

Figure 2:
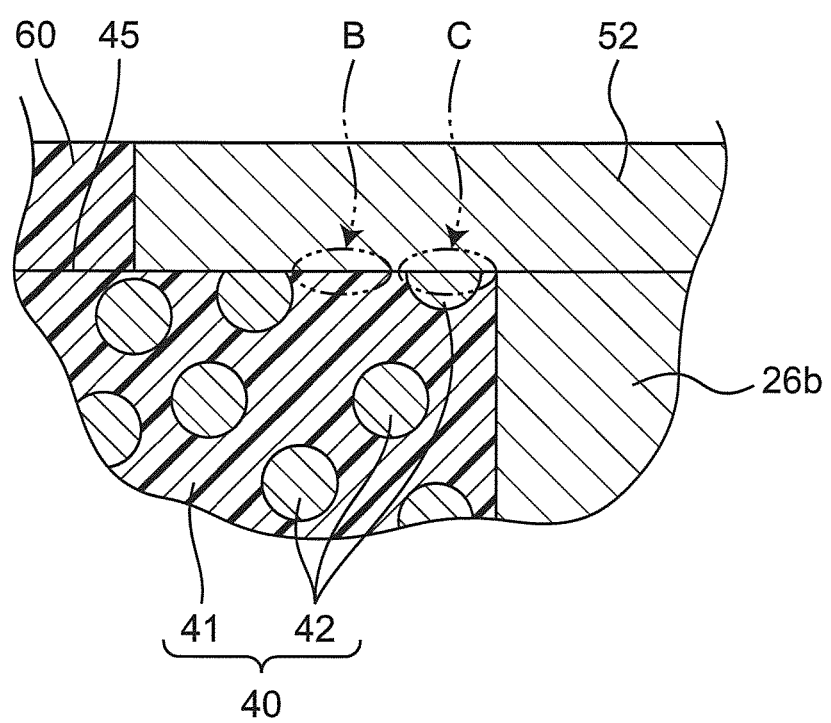
FIG. 2 is an enlarged view of a portion A of FIG. 1.

FIG. 2 is an enlarged view of a portion A of FIG. 1. As shown in FIGS. 1 and 2, the principal surface 45 on the exterior of the composite body 40 is a ground surface formed by grinding. On the principal surface 45, the metal powder 42 is exposed from the resin material 41. It is assumed that this exposure includes not only the exposure to the outside of the electronic component 1 but also the exposure to another member, i.e., the exposure at a boundary surface to another member.

The metal film (the first and second external electrode 51, 52) is in contact with the resin material 41 and the metal powder 42 of the composite body 40. The average particle diameter of crystals of the metal film contacting the resin material 41 (a portion B of FIG. 2) is 60% or more and 120% or less of the average particle diameter of crystals of the metal film contacting the metal powder 42 (a portion C of FIG. 2). A state of the metal film having a small difference in average particle diameter of crystals between on the metal powder 42 and on the resin material 41 as described above corresponds to a state in which a metal film with a comparatively small particle diameter has been able to be formed on the resin material 41.

Specifically, in general, a metal film formed on the composite body 40 by plating starts precipitating on the metal powder 42 and gradually precipitates around the metal powder 42 including on the resin material 41. As described later, the average particle diameter of crystals of the metal film formed by plating becomes larger in a region of later precipitation than a region of earlier precipitation. Therefore, as in the metal film described above, when a difference in average particle diameter of crystals is small between the metal film contacting the metal powder 42, i.e., the metal film precipitating earlier, and the metal film contacting the resin material 41, this corresponds to the fact that the metal film has been able to be formed on the resin material 41 in a comparatively early stage and that the metal film with a comparatively small particle diameter has been able to be formed on the resin material 41.

The adhesion between the metal film and the resin material 41 different in material is significantly affected by the anchor effect due to contact between the metal film and the resin material 41 along unevenness. Since the metal film has a small particle diameter, even when the resin material 41 has slight unevenness, the metal film can be formed along the unevenness. Therefore, the metal film easily produces the anchor effect between the metal film and the resin material 41 so that the adhesion between the resin material 41 and the metal film can be improved. Thus, the adhesion on the resin material 41 can be ensured to improve the adhesion of the entire metal film to the composite body 40. Particularly, this effect is prominently produced when the particle diameter of the metal powder 42 becomes smaller, i.e., when the surface roughness of the principal surface 45 of the composite body 40 is reduced, or a proportion of the resin material 41 is increased due to shedding of particles of the metal powder 42 from the principal surface 45.

For a method of reducing a difference in average particle diameter of crystals of the metal film between on the metal powder 42 and on the resin material 41, the metal film may be formed by using electroless plating. Particularly, as compared to electrolytic plating, the electroless plating can make the timings of precipitations of the metal film closer between on the metal powder 42 and on the resin material 41 so as to make the difference in the average particle diameter smaller. Specifically, although barrel plating is generally employed for small mass-produced products such as the electronic component 1 from the viewpoint of manufacturing efficiency when electrolytic plating is performed, this leads to large variations in precipitation timing in portions of the metal film formed on the resin material 41 because timing of energization varies for each particle of the metal powder 42. In contrast, in the electroless plating, the metal film starts precipitating on the metal powder 42 coming into contact with a plating solution and, since the particles of the metal powder 42 come into contact with the plating solution at relatively uniform timings, the precipitation timings can be made relatively uniform over the portions of the formed metal film. Since the electroless plating makes the precipitation timings closer to each other in the portions of the metal films in this way, the difference in average particle diameter of crystals of the metal film can be made smaller between on the metal powder 42 and the resin material 41. When the particle diameter of the metal powder 42 becomes small and a proportion of the resin material 41 increases on the principal surface 45, variations in the precipitation timing of the electrolytic plating become larger and, therefore, a difference from the electroless plating becomes prominent in such a case.

In the case of a film formed by sputtering or vapor deposition, since a difference itself in average particle diameter of crystals due to formation timing is considered to be small as compared to plating, it is considered to be difficult to produce the same effect. As compared to sputtering or vapor deposition, a metal film formed by using plating has high adhesion to the metal powder 42 and, therefore, the plating is preferably used from the viewpoint of the adhesion of the entire metal film to the composite body 40. Also from the viewpoints of equipment, processes, a formation time, high manufacturing efficiency such as the number of treatments, and low electric resistivity of the metal film, the plating is preferably used as compared to sputtering or vapor deposition. Although a technique exists that uses a resin electrode film containing metal powder in a resin material instead of the metal film, the resin electrode film must have the film thickness of the resin electrode film increased to some extent so as to ensure adhesion to the composite body and the film strength and conductivity of the resin electrode film itself. However, limitations are often placed on the thickness of the external electrodes 51, 52 of the electronic component 1 from the viewpoints of low profile and miniaturization. As a result, sufficient adhesion, film strength, and conductivity may not be ensured by the resin electrode film. In contrast, as compared to the resin electrode film, the electronic component 1 has smaller decreasing rates of the adhesion to the composite body 40 and the film strength and conductivity of the metal film itself even when the film thickness is reduced. Therefore, as compared to the resin electrode film, the electronic component 1 can include the metal film excellent in adhesion, film strength, and conductivity while achieving a lower profile.

A ratio of average particle diameters in this application is obtained by calculating an average particle diameter of crystals (particle aggregates) of a metal film from an FIB-SIM image of a cross section of the metal film. The FIB-SIM image is a cross-sectional image observed by using an FIB (Focused Ion Beam) with an SIM (Scanning Ion Microscope). A method of calculating an average particle diameter may be a method including obtaining a particle size distribution from image analysis of the FIB-SIM image and determining a particle diameter at the integrated value of 50% (D50, median diameter) as the average particle diameter. However, since a ratio (relative value) rather than an absolute value of the average particle diameter is important, if the image analysis is difficult, a method may be used that includes measuring a plurality of maximum diameters of crystals of the metal film as particle diameters in the FIB-SIM image and obtaining an arithmetic mean value thereof as the average particle diameter.

In the calculation, the number of particles of metal powder to be measured in terms of particle diameter may be about 20 to 50. The "crystals of the metal film contacting the resin material 41" and the "crystals of the metal film contacting the metal powder 42" covered by the calculation are not strictly limited to the crystals directly contacting the resin material 41 or the metal powder 42 and include crystals present within a range of about 1 μm from the interface between the metal film and the resin material 41 or the interface between the metal film and the metal powder 42 in the film thickness direction of the metal film. Although a relation of the ratio of the average particle diameter is preferably established in the entire metal film, the effect is produced even when the relation is established in a portion of the metal film. Therefore, the average particle diameter may be calculated from an FIB-SIM image of a portion of the metal film or may be calculated from an FIB-SIM image within a range of about 5 μm in the direction along the principal surface 45, for example.

The electroless plating can reduce the unevenness in film thickness of the metal film because of the precipitation timing described above. In contrast, the electrolytic plating makes the film thickness of the metal film on the resin material smaller than the film thickness of the metal film on the metal powder.

Figure 3:
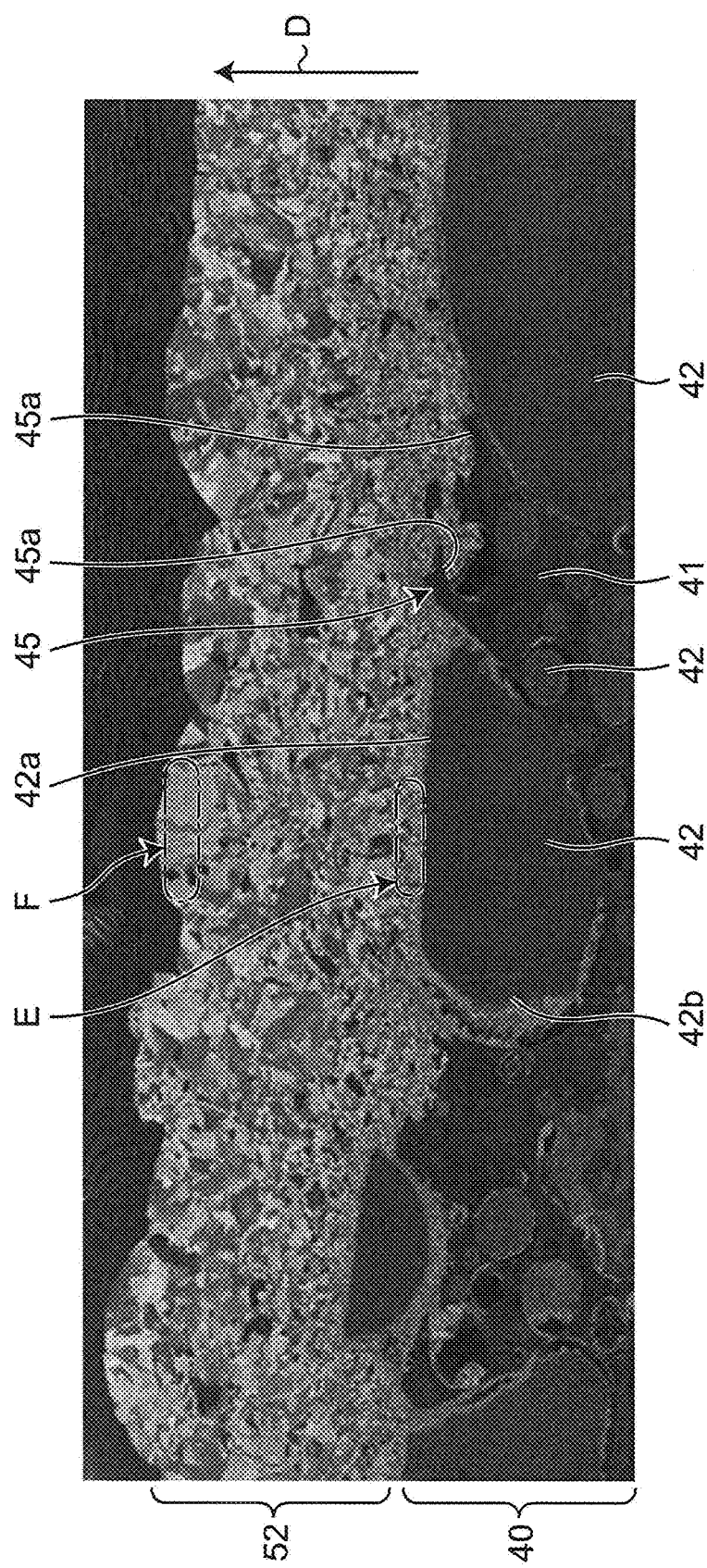
FIG. 3 is a cross-sectional image of an interface between a metal film formed by using electroless plating and a composite body, corresponding to FIG. 2.

Preferably, the principal surface 45 of the composite body 40 has recesses in a portion thereof, and the inside of the recesses are filled with the metal film. FIG. 3 is a cross-sectional image (FIB-SIM image) of an interface between the metal film (second external electrode 52) formed by using the electroless plating and the composite body 40, corresponding to FIG. 2. It is noted that an interface between the first external electrode 51 and the composite body 40 is represented by the same image. As shown in FIG. 3, the principal surface 45 of the composite body 40 may have in a portion thereof recesses 45a formed by shedding of particles of the metal powder 42 during grinding, for example. In this case, if the recesses 45a are filled with the metal film as shown in FIG. 3, the anchor effect between the metal film and the resin material 41 is further enhanced so that the adhesion between the metal film and the composite body 40 can further be improved. The recesses 45a may be formed by shedding portions of particles of the metal powder 42 as shown in FIG. 3 or may be formed by shedding whole particles of the entire metal powder 42. The metal film may completely fill the recesses 45a as shown in FIG. 3 or may partially fill the recesses 45a.

Preferably, a portion of the film thickness of the metal film on the metal powder 42 is equal to or less than the film thickness of the metal film on the resin material 41. As a result, the unevenness in the electronic component 1 can be reduced. Particularly when the metal film serves as the external electrodes 51, 52, the mounting stability and the reliability are improved. If the metal film serves as internal electrodes, the stability at the time of lamination is improved.

The metal film is in contact with the internal electrodes 26a, 26b. As a result, the metal film and the internal electrodes 26a, 26b are sterically disposed. In this case, as shown in FIG. 1, the metal film is disposed on a layer different from the internal members (e.g., the first and second coil conductors 21, 22) of the electronic component 1 in contact through the internal electrodes 26a, 26b. As a result, internal members can be disposed in the electronic component 1 without being affected by the disposition area of the metal film. For example, the electronic component 1 allows the internal electrodes 26a, 26b to be reduced in a planar direction parallel to the principal surface 45 to accordingly increase the proportion of the composite body 40, so that the inductance value can be improved. Alternatively, the electronic component 1 allows the internal electrodes 26a, 26b to be reduced in width in the planar direction in the same way to make the external size accordingly smaller, so that the mounting area can be reduced. On the other hand, for example, if the external electrodes 51, 52 and the internal electrodes 26a, 26b are integrated as in the case of columnar external electrodes embedded in the composite body 40, the internal electrodes 26a, 26b reduced in width as described above may lead to smaller areas of the external electrodes 51, 52 exposed from the composite body 40, resulting in a reduction in the mounting stability.

Preferably, the metal film and the internal electrodes 26a, 26b are made of the same material. As a result, the adhesion between the metal film and the internal electrodes 26a, 26b is improved.

The metal powder 42 is exposed from the resin material 41 at the principal surface 45, and the metal film is disposed on the principal surface 45. As a result, when the metal film is formed on the principal surface 45 as described above, the exposed metal powder 42 can be used and the manufacturing efficiency is improved.

A shape of the metal powder 42 exposed from the resin material 41 includes a shape acquired by cutting a portion of an ellipsoid. The ellipsoid includes a spherical shape. A portion of the metal powder 42 may be cut during grinding of the principal surface 45, for example. In this case, since a cut surface of the metal powder 42 is parallel to the principal surface 45 as shown in FIG. 2 and the metal film can be precipitated along this flat surface, the metal film formed on this metal powder 42 can be improved in the adhesion to the composite body 40.

The principal surface 45 has a portion without the metal film disposed thereon, a resin film 60 is disposed on the portion, and the resin film 60 covers the metal powder 42 exposed from the resin material 41. For example, the resin film 60 is made of a highly electrically insulating resin material such as an acrylic resin, an epoxy resin, and polyimide. As a result, since the resin film 60 covers the metal powder 42 exposed from the resin material 41, the exposure of the metal powder 42 to the outside can be prevented. The thickness of the resin film 60 is, for example, 1 μm or more and 10 μm or less, and is preferably smaller than the thickness of the first and second external electrodes 51, 52 in consideration of the mounting stability.

The metal film is partially disposed on the resin film 60. As a result, as described later, the resin film 60 can be substituted for a mask at the time of pattern formation of the metal film, and the manufacturing efficiency of the metal film formation is improved.

Preferably, the metal powder 42 is made of metal or alloy containing Fe, and the metal film is made of metal or alloy containing Cu. As a result, the metal film can be formed by the electroless plating without using a catalyst. Since the metal powder 42 is made of metal or alloy containing Fe, the magnetic permeability of the composite body 40 can be improved and, since the metal film is made of metal or alloy containing Cu, the conductivity of the first and second external electrodes 51, 52 can be improved.

Preferably, the film thickness of the metal film on the metal powder 42 is 60% or more and 160% or less of the film thickness of the metal film on the resin material 41. As a result, the film thickness of the metal film becomes uniform. Therefore, the unevenness in the electronic component can be reduced. Particularly, when the metal film serves as the external electrodes 51, 52, the mounting stability and the reliability are improved. The film thickness may be calculated from the image analysis, or may directly be measured, in the FIB-SIM image of FIG. 3, for example. Although the relation of the ratio of the film thickness is preferably established in the entire metal film, the effect is produced even when the relation is established in a portion of the metal film. Therefore, the film thickness may be calculated from an FIB-SIM image of a portion of the metal film or may be calculated from an FIB-SIM image within a range of about 5 μm in the direction along the principal surface 45, for example, or the film thicknesses measured at several positions (e.g., five positions) each on the resin material 41 and the metal powder 42 may be compared. In comparison of the film thicknesses, preferably, the comparison is made between the average values of the respective film thicknesses on the resin material 41 and the metal powder 42.

Pd does not exist in the interface between the metal powder 42 and the metal film as well as the interface between the resin material 41 and the metal film. As a result, the metal film is formed without applying a catalyst, and the manufacturing efficiency of the metal film formation is improved. In contrast, if a glass epoxy board is plated, a catalyst must be applied to the entire surface of the board, which increases the number of processes.

While Pd does not exist in the interface between the resin material 41 and the metal film, Pd may exist in the interface between the metal powder 42 and the metal film. In this case, the metal film can be formed by electroless plating by using the catalyst Pd. In particular, even if the metal film is baser than the metal powder 42, for example, if the metal powder 42 is made of metal or alloy containing Cu and the metal film is made of metal or alloy containing Ni, a displacement Pd catalyst treatment can be performed to form the metal film by using the electroless plating. Therefore, a degree of freedom is improved in terms of material selection for the metal powder 42 and the metal film.

As shown in FIG. 3, a portion of the metal film formed by using the electroless plating goes around along the outer surface of the metal powder 42 to the inner side of the composite body 40. Specifically, as indicated by a light-colored portion extending along the outer surface of the metal powder 42 of FIG. 3, the metal film acting as the external electrode 52 has penetrated along the outer surface of the metal powder 42 into a gap between the resin material 41 and the metal powder 42. In this way, the metal film has precipitated not only on an exposed surface 42a exposed from the resin material 41 of the metal powder 42 but also on the contained surface 42b contained in the resin material 41 of the metal powder 42. Therefore, since a portion of the metal film goes around along the outer surface of the metal powder 42 to the inner side of the composite body 40, an increase in area of contact with the metal powder 42 improves the bonding force with the metal powder 42, and the contact with the composite body 40 along the shape of the gap between the resin material 41 and the metal powder 42 improves the anchor effect with the composite body 40. It is considered that the structure described above is formed by infiltration of an electroless plating solution between the resin material 41 and the metal powder 42.

As shown in FIG. 3, a crystal particle diameter of the metal film formed by using the electroless plating is made larger from the side contacting with the composite body 40 toward the opposite side thereof (in the direction of an arrow D). In particular, the average particle diameter of crystals of the metal film formed by using the electroless plating becomes larger in a region of later precipitation than a region of earlier precipitation. In this case, the crystal particle diameter of the metal film on the side contacting with the composite body 40 (a portion E of FIG. 3) is relatively smaller than the crystal particle diameter of the metal film on the side away from the composite body 40 (a portion F of FIG. 3). As a result, the metal film easily produces the anchor effect with the resin material 41, so that the adhesion between the metal film and the composite body 40 can be improved.

A method of manufacturing the electronic component 1 will be described with reference to FIGS. 1 and 2.

First, a portion of the composite body 40 made of a composite material of the resin material 41 and the metal powder 42 is ground to expose the metal powder 42 from a ground surface (the principal surface 45) of the composite body 40 (hereinafter referred to as a grinding step).

Subsequently, the metal film (the external electrode 51, 52) is formed on the ground surface of the composite body 40 by using the electroless plating (hereinafter referred to as a metal film formation step). Specifically, when the metal powder 42 is made of metal or alloy containing Fe and the metal film is made of metal or alloy containing Cu, immersion of the composite body 40 into an electroless plating solution causes precipitation of Cu displacing Fe, and the plating subsequently grows due to the effect of a reducing agent contained in the electroless plating solution.

As a result, the adhesion between the metal film and the composite body 40 and the film strength and conductivity of the metal film itself can be improved as described above. Additionally, a desired thickness can be acquired with reduced variations, and the metal film can be formed by a simple method with a high manufacturing efficiency.

At the metal film formation step, the metal film is formed on the resin material 41 and the metal powder 42 by using the electroless plating. As a result, the adhesion between the metal film and the resin material 41 can be ensured as described above.

At the metal film formation step, the metal film is formed by using a displacement precipitation reaction to precipitate the metal film on the metal powder 42 exposed from the ground surface and by growing the precipitated metal film by using the electroless plating. As a result, the metal film can be formed in a simple process. At the metal film formation step, the electroless plating is performed without applying a catalyst. As a result, the metal film can be formed in a simple process.

After the grinding step, the resin film 60 is formed on a region of a portion of the ground surface of the composite body 40 (referred to as a resin film formation step), and the resin film 60 is used as a mask to form the metal film at the metal film formation step. As a result, the pattern formation can be achieved without etching the metal film and, for example, even as compared to the subtractive method and the semi-additive method, the manufacturing efficiency is improved. In this case, the metal film is partially disposed on the resin film 60.

Steps before the grinding step may be commonly performed steps and include, for example, a step of forming the first and second coil conductors 21, 22 and the electrodes 25a to 25d on the upper and lower surfaces of the board 10 having a hole at the center, a step of covering the board 10 and the first and second coil conductors 21, 22 with the insulator 30, and a step of covering the insulator 30 with the composite body 40. The internal electrodes 26a, 26b are acquired by filling holes disposed in the insulator 30 and the composite body 40 with a conductivity paste.

The present disclosure is not limited to the embodiments described above and may vary in design without departing from the spirit of the present disclosure.

Although the metal film is used as the external electrodes in the embodiments, the metal film may be used as the internal electrodes, routing wirings, etc. In particular, the composite body 40 may be substituted for the board, and the first and second coil conductors 21, 22 may be formed on the composite body 40 as the metal film by using the electroless plating. As a result, the metal film having the effects described above can be acquired as the first and second coil conductors 21, 22, and the metal film can be formed as is the case with the effects described above. In this case, the film thickness of the metal film can be 40 μm or more and 120 μm or less, for example.

Although the resin film is left as a mask in the embodiments, the resin film may eventually be exfoliated.

Although the electronic component is a coil component in the embodiments, the electronic component may be a passive component such as a capacitor, an LC composite component, a thermistor, and a piezoelectric sensor. In this case, the particles may be electric conductors.

The coil component defined as the electronic component is not limited to a component according to a thin-film construction method and may be a component according to a lamination construction method.

The particles contained in the composite body may have any particulate shape and have no limitation on particle diameter. As the particle diameter becomes smaller, the effect of the present disclosure has a relatively larger impact; however, even when the particle diameter is large, the adhesion between the resin material and the metal film can be improved so as to improve the overall adhesion of the metal film.

The invention claimed is:

1. An electronic component comprising:
   a composite body made of a composite material of a resin material and a metal powder; and
   a metal film disposed on an outer surface of the composite body, wherein
   the metal film is in contact with the resin material and the metal powder of the composite body, and wherein
   an average particle diameter of crystals of the metal film contacting the resin material is 60% or more and 120% or less of an average particle diameter of crystals of the metal film contacting the metal powder.

2. The electronic component according to claim 1, wherein a portion of the film thickness of the metal film on the metal powder is equal to or less than the film thickness of the metal film on the resin material.

3. The electronic component according to claim 1, wherein
   the metal powder is made of metal or alloy containing Fe, and wherein
   the metal film is made of metal or alloy containing Cu.

4. The electronic component according to claim 1, wherein
   the film thickness of the metal film on the metal powder is 60% or more and 120% or less of the film thickness of the metal film on the resin material.

5. The electronic component according to claim 1, wherein Pd does not exist in the interface between the metal powder and the metal film as well as the interface between the resin material and the metal film.

6. The electronic component according to claim 1, wherein
   Pd does not exist in the interface between the resin material and the metal film, and
   Pd exists in the interface between the metal powder and the metal film.

7. The electronic component according to claim 1, wherein a portion of the metal film goes around along the outer surface of the metal powder to an inner side of the composite body.

8. The electronic component according to claim 1, wherein the outer surface of the composite body has a recess such that the inside of the recess is filled with the metal film.

9. The electronic component according to claim 1, wherein a crystal particle diameter of the metal film is made larger from a side contacting with the composite body toward an opposite side thereof.

10. The electronic component according to claim 1, further comprising an internal electrode embedded in the composite body, wherein
    the metal film is in contact with the internal electrode.

11. The electronic component according to claim 10, wherein the metal film and the internal electrode are made of the same material.

12. The electronic component according to claim 1, wherein
    the outer surface of the composite body has a principal surface, and wherein
    the metal powder is exposed from the resin material at the principal surface and the metal film is disposed thereon.

13. The electronic component according to claim 12, wherein a shape of the metal powder exposed from the resin material includes a shape acquired by cutting a portion of an ellipsoid.

14. The electronic component according to claim 12, wherein
a resin film is disposed on a portion of the principal surface without the metal film disposed thereon, and wherein
the resin film covers the metal powder exposed from the resin material.

15. The electronic component according to claim 14, wherein the metal film is partially disposed on the resin film.

* * * * *